(12) United States Patent
Bolcato et al.

(10) Patent No.: US 9,429,594 B2
(45) Date of Patent: Aug. 30, 2016

(54) TERMINAL CONNECTION DEVICE FOR A POWER CABLE

(71) Applicant: 3M INNOVATIVE PROPERTIES COMPANY, St. Paul, MN (US)

(72) Inventors: Giuliano Bolcato, Pioltello (IT); Jens Weichold, Neuss (DE); Pasquale J. Zanoli, Pioltello (IT); Mark Gravermann, Neuss (DE); Michael H. Stalder, Neuss (DE); Holger Kurzhals, Neuss (DE); Sebastian Eggert, Neuss (DE); Christian Weinmann, Neuss (DE)

(73) Assignee: 3M Innovative Properties Company, St. Paul, MN (US)

( * ) Notice: Subject to any disclaimer, the term of this patent is extended or adjusted under 35 U.S.C. 154(b) by 263 days.

(21) Appl. No.: 14/368,030

(22) PCT Filed: Dec. 19, 2012

(86) PCT No.: PCT/US2012/070442
§ 371 (c)(1),
(2) Date: Jun. 23, 2014

(87) PCT Pub. No.: WO2013/096354
PCT Pub. Date: Jun. 27, 2013

(65) Prior Publication Data
US 2014/0370741 A1    Dec. 18, 2014

Related U.S. Application Data

(60) Provisional application No. 61/662,713, filed on Jun. 21, 2012.

(30) Foreign Application Priority Data

Dec. 21, 2011 (EP) .................................... 11194804

(51) Int. Cl.
*H02G 15/00* (2006.01)
*G01R 15/16* (2006.01)
(Continued)

(52) U.S. Cl.
CPC .............. *G01R 15/16* (2013.01); *G01R 15/06* (2013.01); *G01R 15/142* (2013.01);
(Continued)

(58) Field of Classification Search
CPC .. G01R 15/16; G01R 19/0084; G01R 15/06; G01R 15/142; H01B 9/006; H01R 13/5845; H01R 43/26; H01R 4/10; H02G 15/184; H02G 15/064
USPC ......... 174/257, 73.1, 102 SC, 106 SC, 84 R, 174/71 R, 140 R
See application file for complete search history.

(56) References Cited

U.S. PATENT DOCUMENTS 3,515,798 A    6/1970    Sievert
4,135,553 A    1/1979    Evans
(Continued)

FOREIGN PATENT DOCUMENTS

CA    2107383         4/1994
DE    2409595 A1    8/1975
(Continued)

OTHER PUBLICATIONS

Hobejogi, t. et al: "Coaxial Capacitive Voltage Divider with High Division Ratio for High Voltage Pulses with Very Fast Rise Times", Pulsed Power Conference (PPC), 2011 IEEE, Jun. 19-23, 2011, pp. 313-318.
(Continued)

*Primary Examiner* — Steven T Sawyer
(74) *Attorney, Agent, or Firm* — Gregg H. Rosenblatt (57) ABSTRACT

Terminal connection device for connecting an end of a medium- or high-voltage power cable to a connection point, comprising an interface cable, an inner conductor and a conductive or semiconductive layer. The terminal connection device further comprises a first stress control tube comprising a stress control element and an insulation layer arranged around the stress control element. The terminal connection device further comprises a first cable connector for connecting the interface cable to the power cable. The terminal connection device further comprises a second stress control tube comprising a stress control element and an insulating layer arranged around the stress control element, wherein the second stress control tube is mounted over the second end portion of the interface cable and at least a portion of the first cable connector. The terminal connection device further comprises one or more tubular shrinkable sleeves.

13 Claims, 5 Drawing Sheets

(51) Int. Cl.
  *H02G 15/184* (2006.01)
  *G01R 15/14* (2006.01)
  *G01R 15/06* (2006.01)
  *G01R 19/00* (2006.01)
  *H01B 9/00* (2006.01)
  *H01R 13/58* (2006.01)
  *H01R 13/66* (2006.01)
  *H01R 43/26* (2006.01)
  *G01R 15/18* (2006.01)

(52) U.S. Cl.
  CPC ......... *G01R 19/0084* (2013.01); *H01B 9/006* (2013.01); *H01R 13/5845* (2013.01); *H01R 13/6683* (2013.01); *H01R 43/26* (2013.01); *H02G 15/184* (2013.01); *G01R 15/181* (2013.01); *Y10T 29/49208* (2015.01)

(56) References Cited

U.S. PATENT DOCUMENTS

| | | | |
|---|---|---|---|
| 4,179,320 A | 12/1979 | Midgley | |
| 4,424,410 A * | 1/1984 | Edgerton | H02G 15/103 174/73.1 |
| 4,503,105 A | 3/1985 | Tomioka | |
| 4,585,607 A | 4/1986 | Krackeler | |
| 4,656,070 A | 4/1987 | Nyberg | |
| 4,791,245 A * | 12/1988 | Thornley | H02G 15/068 174/73.1 |
| 4,822,952 A * | 4/1989 | Katz | H02G 15/064 156/49 |
| 4,963,819 A | 10/1990 | Clarke | |
| 5,098,752 A | 3/1992 | Chang | |
| 5,495,650 A | 3/1996 | Crepel | |
| 5,577,310 A | 11/1996 | Cheenne-Astorino | |
| 5,584,625 A | 12/1996 | Petri | |
| 5,747,744 A | 5/1998 | Kraft | |
| 5,821,459 A * | 10/1998 | Cheenne-Astorino | H02G 15/103 174/73.1 |
| 5,985,062 A * | 11/1999 | Vallauri | H02G 15/1826 156/51 |
| 6,015,629 A | 1/2000 | Heyer | |
| 6,031,368 A | 2/2000 | Klippel | |
| 6,045,373 A | 4/2000 | Hardt | |
| 6,176,659 B1 | 1/2001 | Hardt | |
| 6,340,794 B1 * | 1/2002 | Wandmacher | H02G 15/068 174/73.1 |
| 7,850,492 B1 | 12/2010 | Straka et al. | |
| 7,901,243 B1 * | 3/2011 | Yaworski | H01R 4/34 439/523 |
| 2006/0054345 A1 * | 3/2006 | Mirebeau | H02G 15/188 174/73.1 |
| 2008/0041605 A1 * | 2/2008 | Wentzel | H02G 15/02 174/36 |
| 2009/0181583 A1 * | 7/2009 | Krabs | H01R 4/726 439/738 |
| 2010/0311281 A1 | 12/2010 | Prest et al. | |
| 2011/0298454 A1 | 12/2011 | Ausserlechner | |

FOREIGN PATENT DOCUMENTS

| | | |
|---|---|---|
| DE | 2939600 | 4/1981 |
| DE | 3702735 A1 | 8/1988 |
| DE | 3813001 | 11/1989 |
| DE | 9002070 | 6/1990 |
| DE | 4125856 | 9/1992 |
| EP | 0291213 | 11/1988 |
| EP | 0399263 | 11/1990 |
| EP | 0435569 | 7/1991 |
| EP | 0470388 | 2/1992 |
| EP | 0500216 | 8/1992 |
| EP | 0541000 | 5/1993 |
| EP | 0572692 | 12/1993 |
| EP | 0692643 | 1/1996 |
| EP | 0716474 | 6/1996 |
| EP | 0819222 | 1/1998 |
| EP | 0966780 | 12/1999 |
| EP | 2608338 | 6/2013 |
| EP | 2698891 | 2/2014 |
| FR | 2736218 | 1/1997 |
| JP | 60-256068 | 12/1985 |
| TW | 434962 B | 5/2001 |
| WO | WO 90-13933 | 11/1990 |
| WO | WO 95-11542 | 4/1995 |
| WO | WO 95-25229 | 9/1995 |
| WO | WO 95-31845 | 11/1995 |
| WO | WO 96-10851 | 4/1996 |
| WO | WO 96-31706 | 10/1996 |
| WO | WO 97-08801 | 3/1997 |

OTHER PUBLICATIONS

Australian Patent Examination Report, dated Dec. 18, 2014, 3pgs.
International Search Report for PCT/US2012/070569, 4pgs.
Taiwan Search Report for Application No. 101148821, dated Feb. 18, 2016, 1pg.
Singapore Search Report in Singapore Application No. 11201403502Y, 3pgs, dated May 13, 2015.
International Search Report for PCT International Application No. PCT/US2012/070442, mailed on May 6, 2013, 3pgs.

* cited by examiner

TERMINAL CONNECTION DEVICE FOR A POWER CABLE

BACKGROUND OF THE INVENTION

1. Field of the Invention

The present invention relates to a terminal connection device for a power cable, in particular a medium or high voltage power cable, and to a method of connecting an end of a medium or high voltage power cable to a connection point.

2. Description of the Prior Art

It is generally known to use radially shrinkable sleeves for enclosing an electrical cable connected to another electrical cable or a stop end. An example of a known radially shrinkable sleeve for covering cable terminations either of cable connectors or stop ends is described in EP-B-0 435 569. The shrinkable sleeve comprises a dielectric material as an intermediate insulating layer, an electric field control inner layer combined with a partially coated inner conductive layer, and an electrically conducting outer layer. Such a multi-layer sleeve is preferably made by extrusion and preferably comprises silicone or EPDM.

When making cable splices or cable end terminations by means of a known radially shrinkable sleeve it is necessary that on one side of the connector a free space is provided (parking position), which corresponds to the complete length of the shrinkable sleeve. After the cable connection is established, the shrinkable sleeve is centered over the cable connection and is then shrunk down either by the application of heat or by the removal of an external or internal support maintaining the shrinkable sleeve in a radially extended state. EP-B-0 541 000 discloses a radially shrinkable sleeve which in its radially expanded state is held by two removable support cores located adjacent each other. Another radially shrinkable sleeve having individual support cores for different sections of the sleeve is disclosed in EP-B-0 966 780. In this known assembly, different sections of the sleeve are concentrically arranged by folding back the sleeve, wherein the individual sections are maintained in their respective radially expanded states by means of removable support cores or similar support elements.

WO90/13933 discloses a plug-in connection, in particular a sleeve for high-voltage plastic cables, comprising an electrical insulator fitting closely onto cable ends, the cable insulator having an electrically conducting stress-controlling body for screening cable conductor connecting elements received herein, an insulating body surrounding the stress-controlling body and an electrically conducting sheath surrounding the insulating body completely or partially. The insulator is provided with axial close-fitting passages merging into the space in the stress-controlling body for the cable conductor connecting elements. The cable conductor connecting elements comprise at least one plug part and at least one counter-plug part and means for mutually locking the plug part and the counter-plug part WO96/10851 aims to provide a simplified connection system for high voltage power cables having ratings up to 400 KV and above, in particular a common cable connection system for all accessories and interconnection. The connection system uses a generally applicable interface for interconnection with a number of different apparatus and includes a cable termination consisting of an elastomeric body, integrated therein is a stress relief device, a connector shield, an insulation having a conical interface surface and an outer conductive screen and a rigid insulator having a conical interface surface corresponding to the interface surface of the cable termination.

When an existing cable termination has to be replaced with a new one (due to repair/maintenance or feature upgrading) without the need to replace the existing power cables (i.e., retro-fitting), the most difficult operation is to re-connect the existing cables to the new termination. Replacing a cable termination requires cutting off the existing cable termination in its installed location. Typically this is a switchgear enclosure, a bus bar cabinet, or adjacent generators, motors, transformers, etc. When the existing cable termination is removed, the remaining power cable is not long enough to be terminated with a standard cable termination and re-connected again to the switchgear pole, bus bar, generator, etc.

Additionally, when a repair is required, the time it takes to reconnect the power cable is a concern in terms of impact on service continuity and penalty costs for energy network management.

Accordingly, there is a need for an improved cable termination, in particular for medium or high voltage power cables, that provides a structural/dimensional solution suitable to be quickly installed and working inside a very limited space.

SUMMARY OF THE INVENTION

The present invention provides a terminal connection device for connecting an end of a medium- or high-voltage power cable to a connection point, the terminal connection device comprising
a) an interface cable having first and second end portions, comprising an inner conductor and a conductive or semi-conductive layer,
b) a first stress control tube comprising a stress control element, and an insulating layer arranged around the stress control element, wherein the first stress control tube is mounted on the first end portion of the interface cable;
c) a first cable connector for connecting the interface cable to the power cable, the first cable connector being connected to the second end portion of the interface cable;
d) a second stress control tube comprising a stress control element, and an insulating layer arranged around the stress control element, wherein the second stress control tube is mounted over the second end portion of the interface cable and at least a portion of the first cable connector;
e) one or more tubular shrinkable sleeves, at least a portion of one of the tubular shrinkable sleeves extending over at least a portion of the first stress control tube and at least a portion of one of the tubular shrinkable sleeves extending over at least a portion of the second stress control tube, wherein the portion of the tubular shrinkable sleeve extending over at least a portion of the first stress control tube is shrunk down around at least a portion of the first stress control tube.

The terminal connection device is effectively an integrated splice and termination with an interface cable between the two portions. Because of its integrated features, the terminal connection device allows for making a quick and straight-forward connection between a cut off power cable and a connection point in a confined space. The terminal connection device of the present invention facilitates easily connecting a power cable to the device and easily connecting the device to a connection point. In addition, its integrated features also reduce the possibility of making mistakes during installation, which can potentially be an issue with a termination that has many individual elements that must be attached to the cable and/or connection point. The connection point may be on a piece of equipment such as a generator or transformer or may be a switchgear pole or bus bar. In particular, the terminal connection device is useful when an existing terminal device, which connects an installed power cable to a connection point, is removed by cutting off the portion of the power cable on which the terminal device is installed. The remaining installed cable is then too short to reach the connection point. A suitable new terminal device must be installed. Because the terminal connection device of the present invention may use a section of commercially available cable for its interface cable, terminal connection devices of the present invention may be easily made in many different lengths and using different types of power cable without adding additional manufacturing costs and, therefore, can accommodate the needs for a variety of lengths and sizes and types of cable terminal devices.

In the terminal connection device of the present invention, a power cable can very easily be connected to the first cable connector. The first cable connector is fixedly connected and arranged within the terminal connection device. A power cable attached to a mating second cable connector can be easily connected to the first cable connector in that the mating second cable connector is inserted into portions of the second stress control tube and tubular sleeve that are held in an expanded state by support cores so as to make electrical connection with the first cable connector by simply plugging the second cable connector into the first cable connector, or vice versa. If an intermediate connector is used, the second cable connector can just as easily be plugged into the intermediate connector. Additionally, a rigid sleeve may be secured around the first cable connector and may extend sufficiently beyond the mating face of the first cable connector to cover the second cable connector once it is mated to the first cable connector. Accordingly, no portion of the terminal connection device needs a parking position or any free space on the power cable.

In a specific aspect of the invention, a portion of at least one of the tubular shrinkable sleeves is shrunk down around a portion of the interface cable.

In another aspect, the tubular shrinkable sleeve extending over at least a portion of the second stress control tube comprises a portion adapted to be shrunk down around a portion of the power cable.

In a further aspect, the first end portion of the interface cable is attached to a lug.

In a yet further aspect, the stress control element of one or both of the first and second stress control tubes is a geometric stress control element or a capacitive stress control element.

In a particular aspect of the invention, the tubular shrinkable sleeve extending over at least a portion of the first stress control tube comprises, on an outer side, one or more skirts for reducing tracking current.

In another aspect, the interface cable further comprises an insulating layer arranged concentrically around at least an axial section of the inner conductor, and the terminal connection device comprises a capacitive voltage sensor including a printed circuit board element. The printed circuit board element may be placed over an electrically isolated piece of conductive or semiconductive material. The electrically isolated piece of conductive or semiconductive material may be arranged on the insulating layer of the interface cable and operable to form an electrode of a sensing capacitor for sensing a voltage of the inner conductor. The insulating layer may be operable to form a dielectric of the sensing capacitor.

In a further aspect, the terminal connection device further comprises additional semiconductive material, arranged concentrically around at least an axial section of the insulating layer on either side of the electrically isolated piece of conductive or semiconductive material. The additional semiconductive material may comprise two semiconductive axial sections, electrically isolated from the electrically isolated piece of conductive or semiconductive material by non-conductive axial sections.

Some or all of the electrically isolated piece of conductive or semiconductive material or of the additional semiconductive material may be affixed adhesively to the insulating layer.

In a specific aspect, the printed circuit board element comprises a patterned gold-plated copper layer in electrical contact with the electrically isolated piece of conductive or semiconductive material.

In another aspect of the invention, the electrically isolated piece of conductive or semiconductive material comprises a portion of the semiconductive layer of the interface cable.

The invention also provides a method of connecting an end of a medium- or high-voltage power cable to a connection point, comprising the steps of a) providing a terminal connection device as described above;

b) providing a medium- or high-voltage power cable;

c) connecting the terminal connection device to the end of the power cable by connecting the interface cable to the end of the power cable via the first cable connector; and d) connecting the terminal connection device to the connection point by connecting the first end portion of the interface cable to the connection point.

In at least one embodiment of the present invention, after the first cable connector is mated to the second cable connector, the second stress control tube is shrunk down around the mated connectors and a portion of the power cable, then the portion of a tubular sleeve extending over a portion of the second stress control tube is shrunk down over the second stress control tube and a portion of the power cable. Because the terminal connection device includes an integrated splice portion and a termination portion, it allows for easy connection to the power cable using the splice portion and easy connection to the connection point using the termination portion.

The first cable connector of the terminal connection device according to at least one embodiment of the invention may be configured as a socket or plug. To ensure that a socket-and-plug connection is capable of carrying high electric currents, the prior art offers various contact techniques as e.g. disclosed in EP-A-0 716 474, DE-A-38 13 001, and DE-A-29 39 600.

If an intermediate connector is used, it can be flexible, partially flexible or rigid. A flexible or partially flexible intermediate connector serves for a facilitated application of a power cable to be connected to the first cable connector. This is advantageous when using the preassembled terminal connection device in a narrow space.

The mechanical and electrical connection between the interface cable and the second cable and their respective connectors, which in turn are to be connected to each other, according to one embodiment of the present invention, is realized by crimping or fastening screws or similar fastening elements. Preferably, the fastening screws are configured as shearable screws. Examples of fastening elements suitable for the connection between a cable (or a stop end element)

and a second cable connector are disclosed in WO-A-95/25229, WO-A-96/31706, EP-B-0 470 388, EP-B-0 688 960, EP-B-0 692 643, EP-A-0 769 825, EP-B-0 819 222, EP-B-0 984 176, and U.S. Pat. No. 6,045,373.

Generally, both heat and cold shrinkable elements can be used for the pre-assembled terminal connection device according to the invention. However, in order to avoid the application of heat for shrinking down the tubes and sleeves, cold shrinkable materials are preferred. These materials are generally known in the art, and preferably silicone or EPDM is used. In case of a cold shrinkable sleeve or tube, a portion of the sleeve or tube can be held in a radially expanded state by means of a removable support core. Suitable supports are generally known to those skilled in the art. In particular, it is known to use at least one support core adapted to be inserted into the cold shrinkable sleeve or tube for holding it in a radially expanded state, and removed from the cold shrinkable sleeve or tube for shrinking down the sleeve or tube. In at least one embodiment of the present invention, the support core holds a portion of a stress control tube in a radially expanded state and comprises a helically wound ribbon that is adapted to be removed from the stress control tube by pulling an end of the ribbon that initiates on a first end of the support core through the center of the core and out the second end of the core such that the pulled end of the ribbon separates from the remainder of the core winding by winding starting from the first end of the core. Examples for various supports as well as cores for holding the second tubular portion in a radially expanded state are disclosed in DE-A-39 43 296, DE,A-42 33 202, WO-A-95/11542, WO-A-95/318 845, EP-A-0 291 213, EP-A-0 399 263, EP-A-0 500 216, EP-A-0 631 117, EP-A-0 631 357, EP-A-0 702 444, EP-B-0 966 780, U.S. Pat. Nos. 3,515,798, 4,135,553, 4,179,320, 4,503,105, 4,656,070, 5,098,752, and 4,585,607.

The second stress control tube can be arranged so as to extend beyond the first cable connector and/or rigid sleeve prior to the terminal connection device being connected to a power cable and, accordingly, is held in a radially expanded state as mentioned before. In an alternative embodiment, the second stress control tube can be folded back over the first cable connector and, if made from a cold shrinkable material, can be held in a radially expanded state.

The stress control tubes comprise in their mounted state an inner layer which is a stress control element and an outer dielectric layer of e.g. silicone or ethylene propylene diene monomer rubber (EPDM). The stress control element may achieve stress control by the use of particular materials, such as High K materials or by the use of geometric stress control shapes. The stress control tube of the splice portion typically further comprises a thin electrically conductive or semiconductive layer inside a portion of the stress control element and a thin electrically conductive or semiconductive layer outside the dielectric layer. Those stress control tubes which can be a push-on type or can be made of heat or cold shrinkable materials are generally known to those skilled in the art. They may be fabricated by a molding process or an extrusion process. To obtain a stress control tube with two layers, a standard coextrusion process may be used, e.g. the inner electrically conductive or semi conductive layer and the outer dielectric layer are extruded together. An example of a suitable molded stress control tube is described and illustrated in WO97/08801.

It is normally necessary to use one tubular sleeve for a splice and one tubular sleeve for a termination. This can be done in the terminal connection device of the present invention in which separate tubular sleeves cover the splice and termination portions of the device. Alternatively, a single tubular sleeve may cover both the splice and termination portions of the device. If two separate tubular sleeves are used, they may overlap between the two portions, typically over a portion of the interface cable. It is also possible to arrange the two tubular sleeves so that they don't overlap. In this case, the outer insulative jacket typically needs to remain in the exposed portion of the interface cable or the interface cable needs to be insulated with a third tubular sleeve or some other type of insulating material. If the terminal connection device uses a particularly long piece of cable for the interface cable, it may be most efficient and economical to leave the insulating jacket on the interface cable.

In at least one embodiment of the present invention, the terminal connection device is pre-assembled in that the first cable connector and the interface cable are fixedly arranged in the stress control tubes and an outer tubular sleeve prior to the use of the terminal connection device for connecting to and terminating a power cable. Pre-assembling is advantageous in that it may make field assembly obsolete. Field assembly of a terminal connection device may be difficult, because the interface cable, which may be relatively short, needs to be stripped and prepared for mounting the stress control tubes and the first cable connector. Preparing the interface cable and mounting stress control tubes and the first cable connector on it in the field poses an increased risk of having dirt particles and air pockets entrapped between layers of the terminal connection device. These particles and air pockets may lead to partial discharges and potential damage to the terminal connection device.

In a further embodiment of the invention, one or more sensors may be integrated into the terminal connection device. Such sensors can be used to sense, measure, record and save or transmit information regarding the condition or operation of the power cable such as current, voltage, temperature, etc. The sensor can be integrated in the terminal connection device of the invention during its construction. A preferred location for the integration of the sensor would be the area between the connector and termination sections or in the termination section. The sensor will typically include some type of information transmission system to transmit the information to an external information collecting and/or processing device. The transmission system may be any suitable system including hard wiring or a wireless transmission system. The sensor may be located on a layer of conductive or semiconductive material that is electrically isolated from the conductive or semiconductive layer of the interface cable. However, a ground current needs to be established across the sensor. To achieve this, a portion of the semiconductive layer may be isolated by removing two annular sections of the semiconductive layer of the interface cable on each side of the portion to be isolated. The sensor is then mounted on and connected to this isolated portion, an insulating material is placed over the sensor and a conductive or semiconductive material is placed over the insulating material to shield the sensor against external electrical fields. Instead of using the interface cable semiconductive layer, the area may be stripped of the cable semiconductive layer and a patch of conductive or semiconductive material may be placed on the insulation layer, e.g., by adhering it to the insulation layer of the interface cable. One sensor might be a capacitive voltage sensor placed over an electrically isolated piece of conductive or semiconductive material with the conductive or semiconductive material arranged on the insulating layer of the interface cable and operable to form an electrode of a sensing capacitor for sensing a voltage of the inner conductor of the interface cable. The insulating layer of the interface cable is operable to form a dielectric of the sensing capacitor.

BRIEF DESCRIPTION OF THE DRAWINGS

A full and enabling disclosure of the present invention, including the best mode thereof, enabling one of ordinary skill in the art to carry out the invention, is set forth in greater detail in the following description, with reference to the accompanying drawings in which.

DESCRIPTION OF PREFERRED EMBODIMENTS

Herein below diverse embodiments of the present invention are described and shown in the drawings wherein like elements are provided with the same reference numerals.

Figure 1:
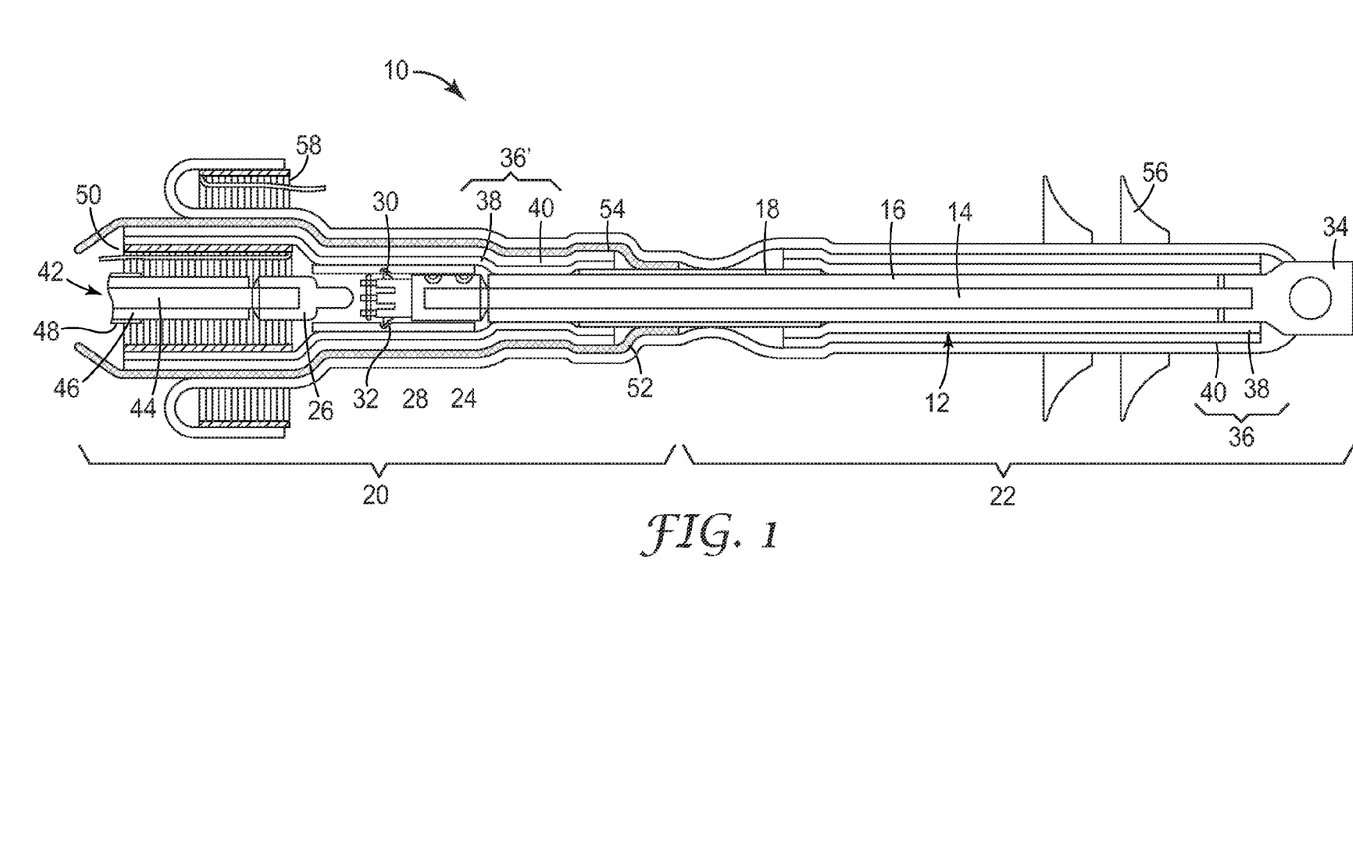
FIG. 1 is a cross-sectional view of a first embodiment of a terminal connection device of the present invention.

FIG. 1 shows a first embodiment of a pre-assembled terminal connection device for connecting an end of a medium- or high-voltage power cable to a connection point. The pre-assembled terminal connection device 10 comprises an interface cable 12 having an inner conductor 14, an insulation layer 16 surrounding conductor 14, and a conductive or semiconductor layer (hereinafter referred to as semiconductor layer) 18 surrounding insulation layer 16. As illustrated in FIG. 1, any additional layers of the interface cable 12, such as a metallic cable screen surrounding semiconductor layer 18 and an outer cable jacket surrounding the metallic cable screen are typically removed. However, in some embodiments, these layers may remain on a portion of interface cable 12. Terminal connection device 10 is effectively comprised of a splice portion 20 and a termination portion 22. In some embodiments an intermediate portion between the splice and termination portions may exist.

In the splice portion 20 of terminal connection device 10, a first cable connector 24 is attached to one end of inner conductor 14 of interface cable 12. It may be attached by any suitable method such as by crimping or with screws. First cable connector 24 is configured to mate with second cable connector 26, which is not part of the pre-assembled terminal connection device 10. For example, first cable connector 24 may be a socket connector and second cable connector 26 may be a plug connector. First cable connector 24 may optionally be enclosed by, and optionally secured within, rigid sleeve 28, which may be insulative, conductive, or semiconductive. Rigid sleeve 28 may optionally extend beyond the mating face of first cable connector 24 such that when first and second cable connectors 24 and 26 are mated, second cable connector 26 is also enclosed by rigid sleeve 28. Connector 26 is attached to the inner conductor 44 of a power cable 42. Inner conductor 44 is surrounded by insulating layer 46, which is surrounded by conductive or semiconductive layer 48. Connector 24 may have a pawl 30 that engages with a notch 32 is rigid sleeve 28 to hold connector 24 securely within rigid sleeve 28. Other suitable means known in the art may be used to secure connector 24 in rigid sleeve 28.

In the termination portion 22 of terminal connection device 10, a lug 34 is typically attached to the end of inner conductor 14 of the interface cable 12 opposite the end attached to connector 24. Semiconductor layer 18 is stripped away from the end of interface cable 12 thereby exposing insulation layer 16. A first stress control tube 36 comprising an inner High K layer 38 and an outer insulation layer 40 is mounted on the end portion of interface cable 12 adjacent lug 34 and extends along the terminal portion 22 of terminal connection device 10 such that it overlaps a portion of semiconductive layer 18 of interface cable 12. First stress control tube 36 is made of a shrinkable material, typically silicone or EPDM. It may be heat or cold shrinkable material. As shown in FIG. 1, it is shrunk down over the termination portion 22 of terminal connection device 10.

As shown in FIG. 1 a second stress control tube 36' extends along the splice portion of connector 10, including over connector 24 and is made long enough to cover connector 26 and a portion of power cable 42 to which connector 26 is attached when the terminal connection device 10 has been fully installed. Similar to first stress control tube 36, second stress control tube 36' is made of a shrinkable material, typically silicone or EPDM. It may be heat or cold shrinkable material, but is shown as a cold shrinkable material in FIG. 1. Second stress control tube 36' differs from first stress control tube 36 in that it has a thin inner semiconductor layer (not shown) inside of stress control layer 38 along the portion of stress control layer 38 that will cover connectors 24 and 26. The length of the thin inner semiconductor layer is sufficient that it covers a portion of insulation layer 16 of interface cable 12 and a portion of insulation layer 46 of power cable 42 when terminal connection device 10 is fully installed. The thin inner semiconductor layer may be painted on the interior surface of stress control layer 38 or may be a separate layer of material. Stress control tube 36' also differs from stress control tube 36 in that it has a thin outer semiconductive layer (not shown) on the outside of insulation layer 40. The thin outer semiconductive layer extends along the entire length of insulation layer 40 of stress control tube 36'. The thin outer semiconductor layer may be painted on the exterior surface of insulation layer 40 or may be a separate layer of material.

As further illustrated in FIG. 1, prior to the mating of first and second cable connectors 24 and 26, a support core 50 is placed within the portion of second stress control tube 36' that will cover power cable 42. Support core 50 holds this portion of second stress control tube 36' in an expanded state to allow the easy insertion of connector 26 into rigid sleeve 28 so that it can securely mate with connector 24. In the embodiment of FIG. 1, terminal connection device 10 further comprises a single tubular sleeve 52 that extends over both the splice and termination portions 20, 22. Tubular sleeve 52 comprises an insulating layer. Between tubular sleeve 52 and second stress control tube 36' there is typically a "sock" 54 made of conducting or semiconducting material. Its purpose is to establish an electrical connection between semiconductive layers 18 and 48 of interface cable 12 and power cable 42, respectively, when terminal connection device 10 is fully installed and to maintain the thin outer semiconductive layer (not shown) of second stress control tube 36' at ground potential across the splice. In the embodiment illustrated in FIG. 1, tubular sleeve 52 is positioned over the entire length of first and second stress control tubes 36 and 36' as well as the portion of interface cable 12 that is not surrounded by either stress control tube. Tubular sleeve 52 is made of a shrinkable material, typically silicone or EPDM. It may be heat or cold shrinkable material, but is shown as a cold shrinkable material in FIG. 1. In the illustrated embodiment, tubular sleeve 52 includes skirts 56 in the termination portion of terminal connection device 10. The skirts serve to reduce tracking current and are usually used only on outdoor termination devices.

As further illustrated in FIG. 1, prior to the mating of first and second cable connectors 24 and 26, a support core 58 is placed around the portion of second stress control tube 36' that is held in an expanded state by support core 50 and a portion of tubular sleeve 52 is folded back over support core 58. This folded back portion of tubular sleeve 52 will cover power cable 42 when the terminal connection device 10 is fully installed.

Support cores 50 and 58 as well as other support cores described herein may be any suitable type of support core, but will typically comprise a helically wound ribbon that is removed by unwinding the ribbon such that the cold shrinkable material shrinks down over power cable 42 starting at the cable end attached to conductor 26. This support core technique is generally known to those skilled in the art.

Figure 2:
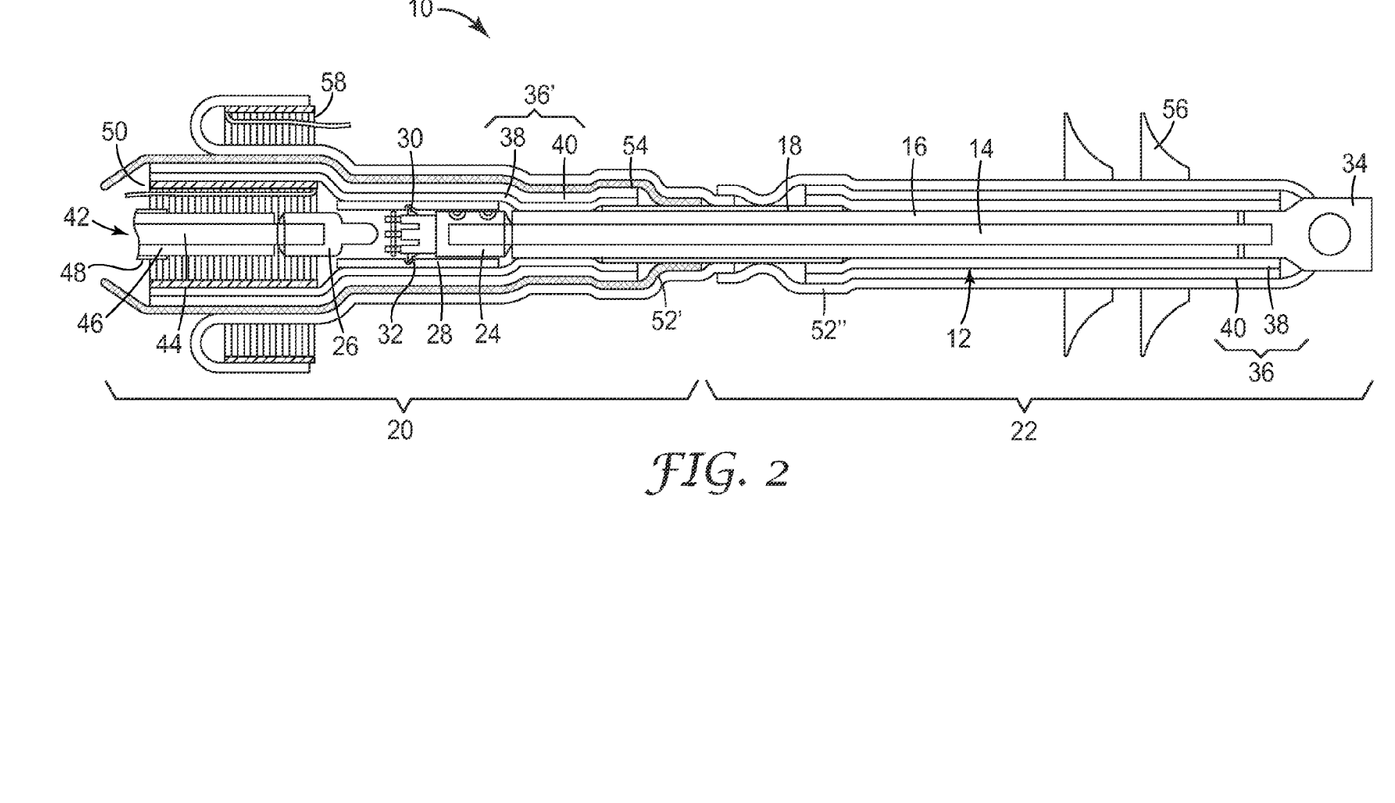
FIG. 2 is a cross-sectional view of an alternate embodiment of the terminal connection device according to FIG. 1.

The embodiment illustrated in FIG. 2 is similar to the embodiment of FIG. 1 except that tubular sleeve 52 comprises two separate parts, 52' and 52". In the embodiment of FIG. 2, parts 52' and 52" have overlapping portions. In an alternate embodiment (not illustrated), parts 52' and 52" do not overlap. In such an embodiment, the portion of interface cable 12 not covered by a tubular sleeve will have some other means of outer insulation. For example, the cable outer insulating jacket may be left on this portion of interface cable 12, or if the outer jacket is removed, a separate layer of shrinkable material may be applied around this portion of interface cable 12.

Figure 3:
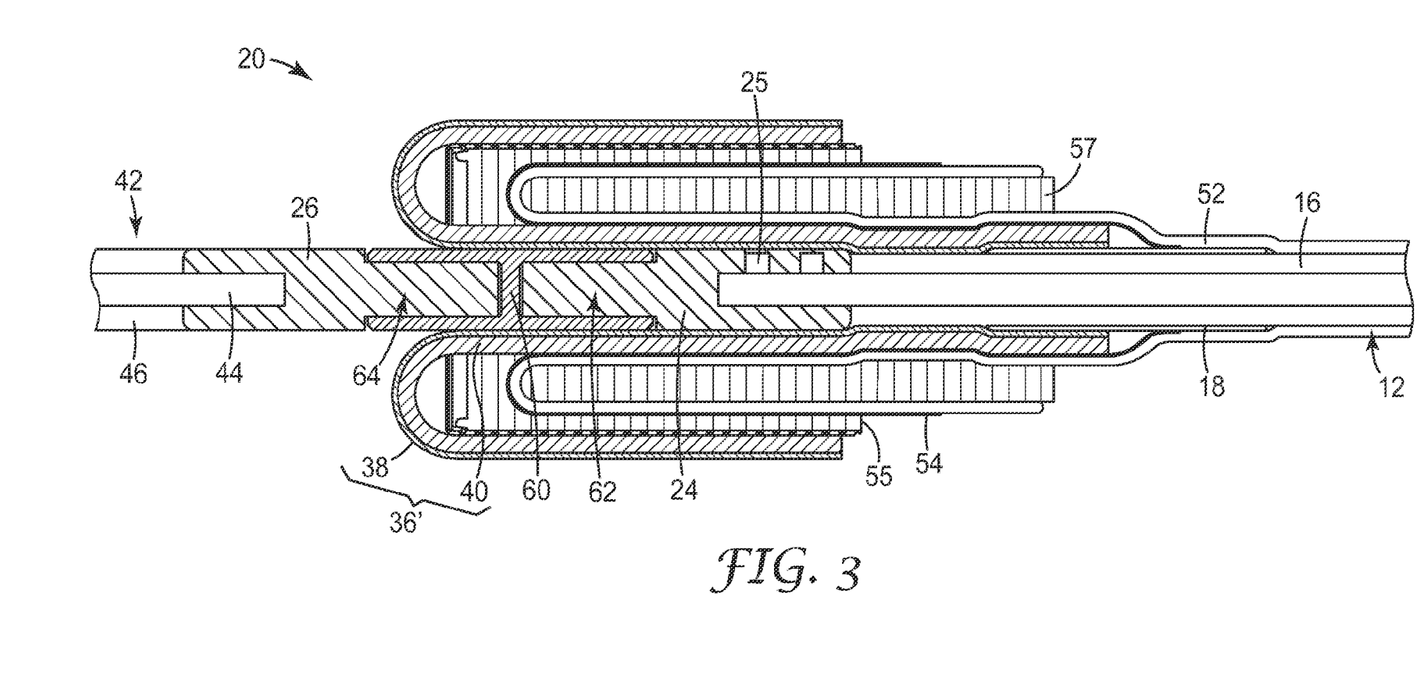
FIG. 3 is a cross-sectional view of a splice portion of a terminal connection device of at least one embodiment of the present invention.

FIG. 3 shows an alternate embodiment of splice portion 20 of terminal connection device 10. In this embodiment, a first cable connector 24 is attached to one end of inner conductor 14 of interface cable 12. It may be attached by any suitable method such as by crimping or with screws. In FIG. 3, it is attached by screws 25. First cable connector 24 is configured to mate with first socket 62 of conductive intermediate connector 60. Intermediate connector 60 has a second socket 64 configured to mate with second cable connector 26 which is attached to inner conductor 44 of a power cable 42. Second cable connector 26 and power cable 42 are not part of the pre-assembled terminal connection device 10. First and second cable connectors 24 and 26 and intermediate connector 60 may optionally be enclosed by, and optionally secured within, a rigid sleeve (not included in FIG. 3), which may be insulative or semiconductive.

As shown in FIG. 3, second stress control tube 36' extends along the splice portion of terminal connection device 10, including over connector 24 and over a portion of intermediate connector 60. As previously described, second stress control tube 36' has a thin inner semiconductor layer (not shown) inside of stress control layer 38 along the portion of stress control layer 38 that will cover connectors 24 and 26 (and intermediate connector 60). The length of the thin inner semiconductor layer is sufficient that it covers a portion of insulation layer 16 of interface cable 12 and a portion of insulation layer 46 of power cable 42 when terminal connection device 10 is fully installed. The thin inner semiconductor layer may be painted on the interior surface of stress control layer 38 or may be a separate layer of material. Stress control tube 36' also has a thin outer semiconductive layer (not shown) on the outside of insulation layer 40. The thin outer semiconductive layer extends along the entire length of insulation layer 40 of stress control tube 36'. The thin outer semiconductor layer may be painted on the exterior surface of insulation layer 40 or may be a separate layer of material. In the embodiment of FIG. 3, splice portion 20 of terminal connection device 10 further comprises a tubular sleeve 52 that extends over stress control tube 36' from interface cable 12 to power cable 42. Tubular sleeve 52 comprises an insulating layer. Between tubular sleeve 52 and second stress control tube 36' there is typically a "sock" 54 made of conducting or semiconducting material. Its purpose is to establish an electrical connection between semiconductive layers 18 of interface cable 12 and semiconductive layer 48 (not shown) of power cable 42, respectively, when terminal connection device 10 is fully installed and to maintain the thin outer semiconductive layer (not shown) of second stress control tube 36' at ground potential across the splice.

As further illustrated in FIG. 3, prior to the mating of second cable connector 26 with intermediate connector 60, both tubular sleeve 52 and stress control tube 36' are folded back over intermediate connector 60, first cable connector 24, and interface cable 12 to allow for easy insertion of second cable connector 26 into intermediate connector 60. First, a support core 57 is placed around tubular sleeve 52 generally over first cable connector 24 and a portion of tubular sleeve 52 is folded back and placed on support core 57, which holds the folded back portion of tubular sleeve 52 in an expanded state. Next, support core 55 is placed over the folded back portion of tubular sleeve 52 and a portion of stress control tube 36' is folded back and placed on support core 55, which holds the folded back portion of stress control tube 36' in an expanded state. After second cable connector 26 is mated with intermediate connector 60, support core 55 is removed and stress control tube 36' is unfolded so that it covers second cable connector 26 and enough of power cable 42 such that stress control layer 38 overlaps the semiconductive layer 48 (not shown) of power cable 42. Subsequently, support core 57 is removed and tubular sleeve 52 is unfolded so that it covers stress control tube 36' and a portion of the outer jacket of power cable 42 (not shown).

Figure 4:
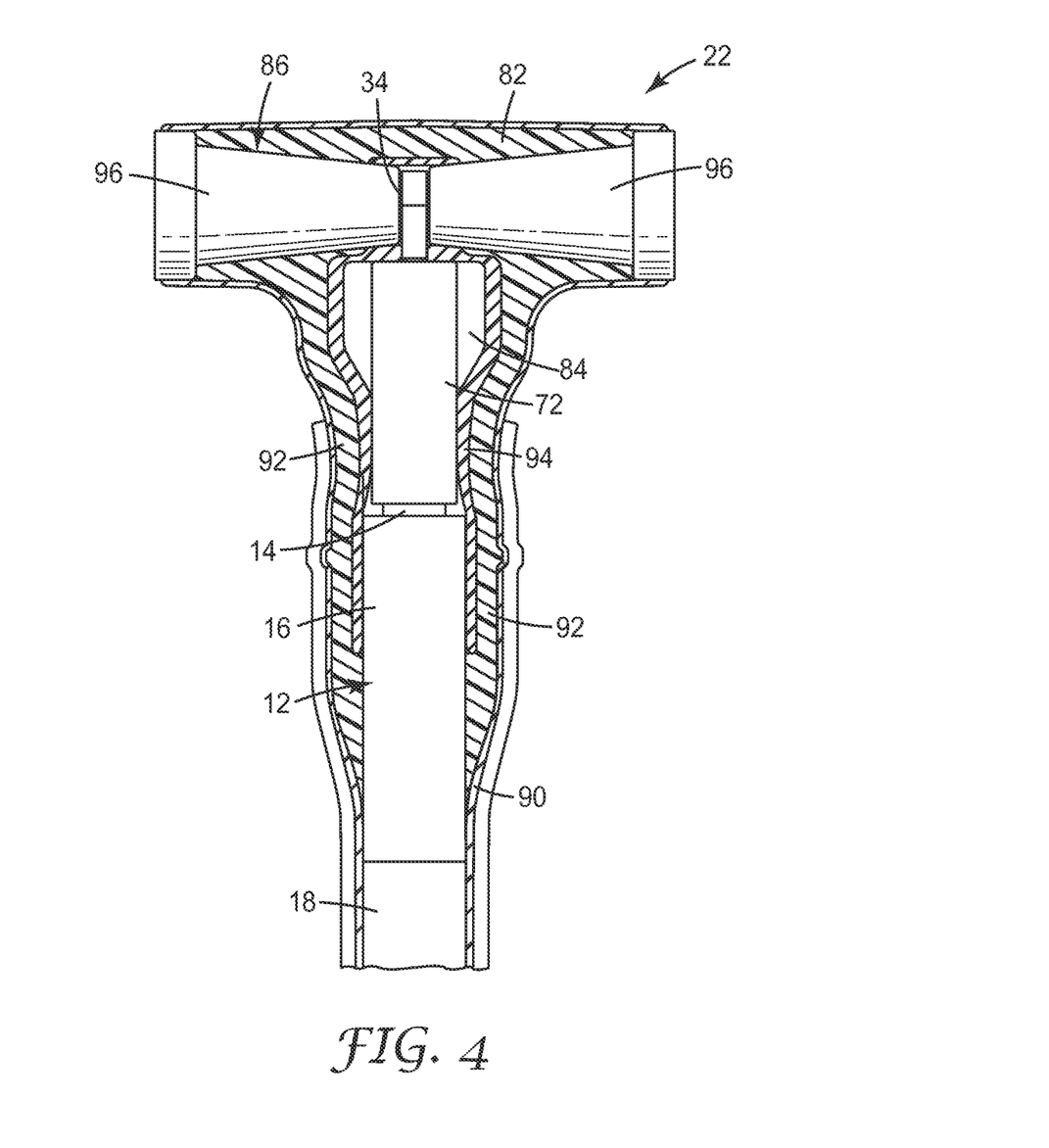
FIG. 4 shows a cross-sectional view of a termination portion of a terminal connection device of at least one embodiment of the present invention.

FIG. 4 is an alternate embodiment of the terminal portion 22 of terminal connection device 10. In this embodiment, geometric stress control is employed instead of a High K stress control material. Further, the terminal portion 22 comprises separable connector elements, which provides for a different type of connection than with a bare lug. FIG. 4 shows a cable connector 72 attached to conductor 14 of interface cable 12. Cable connector 72 is attached by any suitable means, typically by crimping, and includes lug 34. Terminal portion 22 includes housing 82 that generally defines first chamber 84 and second chamber 86. First chamber 84 and second chamber 86 intersect such that the interior of first chamber 84 is in communication with the interior of second chamber 86. First and second chambers 84,86 may intersect to form a general T-shape as shown in FIG. 4 or a general L-shape (not shown). Housing 82 may further include an outer semi-conductive layer 90 and an intermediate insulating layer 92, and an inner semi-conductive layer 94. As shown in FIG. 4, the inner semi-conducting layer 94 on the interior wall of the first chamber 84 of the housing 82 makes intimate contact with the cable connector 72. Preferably, the inner semi-conducting layer 94 also makes intimate contact with the insulation layer 16 of interface cable 12. A portion of the interior wall of first chamber 84 is made of the intermediate insulating layer 92. This portion preferably makes intimate contact with insulation layer 16. A portion of the interior wall of first chamber 84 is made of outer semi-conducting layer 90. This portion preferably makes intimate contact with semiconductive layer 18. Tubular sleeve 52 is then positioned over at least a portion of outer semi-conducting layer 90 and interface cable 12. A stud (not shown) may be inserted through the aperture in lug 34 and one or more mating devices 96 may be inserted into second chamber 86 and attached to, or held in position against, lug 34 by the stud.

Housing 82 may be made from any material suitable for cold-shrink applications. Most suitable are materials such as a highly elastic rubber material that has a low permanent set, such as ethylene propylene diene monomer (EPDM), elastomeric silicone, or a hybrid thereof. The semi-conductive and insulating materials may be made of the same or different types of materials. The semi-conductive and insulating materials may have differing degrees of conductivity and insulation based on the inherent properties of the materials used or based on additives added to the materials.

Figure 5:
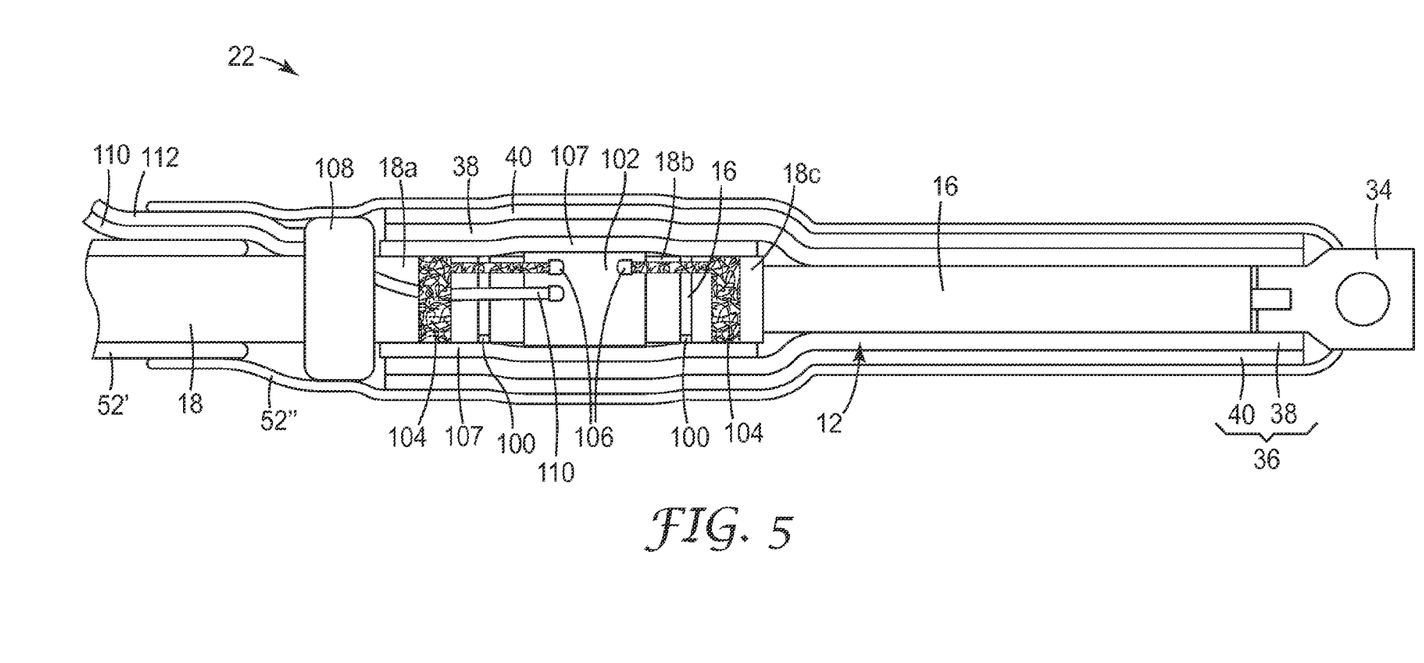
FIG. 5 shows a partial cross-sectional view of a termination portion of a terminal connection device of at least one embodiment of the present invention, wherein the termination portion includes sensor devices.

FIG. 5 is an alternate embodiment of the terminal portion 22 of terminal connection device 10. In this embodiment, voltage and current sensors are integrated in terminal portion 22. In the illustration of FIG. 5, insulating layer 16, semiconductive layer 18 of interface cable 12 as well as the sensors and some related elements are not shown in cross section while stress control tube 36, tubular sleeve 52, and insulating layer 107 are shown in cross section. As shown in FIG. 5, annular strips of semiconductive layer 18 are removed to form non-conductive axial sections or gaps 100 in the semiconductor layer at which gaps the underlying insulation layer 16 is exposed. The portions of semiconductive layer 18 separated by gaps 100 are labeled 18a, 18b, and 18c for clarity. In an alternate embodiment, semiconductive layer 18 may terminate with portion 18a and pieces of a conductive or semiconductive material may be positioned on interface cable 12 to serve the same functions as portions 18b and 18c of semiconductive layer 18. In another alternate embodiment, a conductive or semiconductive material attached to the back of voltage sensor 102, prior to its attachment to interface cable 12, may be used in place of portion 18b of semiconductive layer 18. In yet another embodiment, voltage sensor 102 is attached directly to the insulation layer of interface cable 12. As illustrated in FIG. 5, a voltage sensor 102 is placed on semiconductive layer portion 18b, which is electrically isolated from portions 18a and 18c by gaps 100. Although the present specification refers to attaching a sensor to interface cable 12, in some embodiments, the interface cable 12 itself functions as part of the sensor. In such instances, the reference herein to voltage sensor 102 refers to the portion of the sensor, e.g., a printed circuit board (PCB), which is attached to interface cable 12. In at least one embodiment of the present invention, the voltage sensor is a capacitive divider in which a first capacitor consists of the cable inner conductor 14, the cable insulation layer 16, and semiconductive portion 18b. The second capacitor(s) are placed on a PCB, which is attached to semiconductive layer portion 18b. The inner electrical resistance of the semiconductive layer portion 18b is insignificant.

Strips of insulating material (not shown) cover gaps 100 to separate semiconductive portion 18b from any other conductive or semiconductive material or elements, except from the voltage sensor 102, and to prevent the presence of air in gaps 100, which air could cause a partial electrical discharge and a failure of voltage sensor 102. The insulating material may be any suitable material such a combination of mastic, which will more easily fill gaps 100, and PVC tape placed over the mastic. The PVC tape may also serve the purpose of attaching the voltage sensor 102 to interface cable 12. Voltage sensor 102 measures the voltage of the inner conductor 14 of interface cable 12. A ground plate (not shown) of voltage sensor 102 is electrically connected to one or both of semiconductive layer portions 18a and 18c by a conductive element 104, which may be a wire mesh that can be wrapped around one or both of semiconductive layer portions 18a and 18c and soldered to a connection point 106 on voltage sensor 102. If the portion of conductive element 104 bridging from semiconductive layer portions 18a and 18c to the voltage sensor 102 are not insulated, the strips of insulating material (not shown) over gaps 100 will prevent it from making electrical contact with the underlying semiconductive portion 18b. Insulation layer 107 covers voltage sensor 102 and the portions of semiconductive layer adjacent gaps 100. A layer of conductive or semiconductor material (not shown) is placed over insulation layer 107. In at least one embodiment, the layer of conductive or semiconductive material is combined with insulative layer 107 so that insulative layer 107 has an insulative layer facing the sensor and a layer of conductive or semiconductive material facing stress control tube 36. The conductive or semiconductive layer shields the sensor from external electrical fields. Stress control tube 36 covers insulation layer 107 and extends to the end of interface cable 12 to which lug 34 is attached. Current sensor 108 is positioned over semiconductive layer 18 adjacent to voltage sensor 102. Wire 110 is connected to voltage sensor 102 and wire 112 is connected to current sensor 108, which may be a Rogowski coil. Both wires 110, 112 are insulated so as not to cause any shorting. In FIG. 5, tubular sleeve 52" extends along the entire length of the termination portion 22 of terminal connection device 10 from lug 34 to the splice portion of terminal connection device 10 where it overlaps tubular sleeve 52' of splice portion 20. Both wires 110, 112 pass between the overlapped portions of tubular sleeve 52" and tubular sleeve 52' to the outside of terminal connection device 10 where they may be connected to, for example, an integrator, a measuring device, a control device, or other suitable types of devices.

In at least one embodiment, voltage sensor 102 comprises a double sided flexible printed circuit board. As described herein, the top or front of the PCB is the portion that faces insulative layer 107. The top of the PCB typically includes conductive features that are electrically connected to external devices. The bottom or back of the PCB faces interface cable 12. To establish the best possible electrical contact between sensor 102 and semiconductive layer portion 18b, it is desirable to maximize the contact area on the back of sensor 102. It was found that while a copper foil or gold-plated copper foil would work, a patterned gold-plated copper layer unexpectedly provided superior results over the alternatives. The pattern may be formed in any suitable manner. For example, a photoresist process may be used to create the pattern by applying and developing a photoresist layer on the bottom copper layer of the circuit board (and optionally on portions of the top copper layer outside of the portion circuitized for the sensor to function) in a pattern that exposes areas of the copper layer to be removed to create the desired copper pattern. The exposed portions of the copper layer(s) may then be exposed to a copper etchant solution to remove the exposed areas of copper. The patterned photoresist is then removed, leaving a pattern of copper on the bottom side of the circuit board. A layer of nickel is then plated on the copper and gold or a gold alloy (sometimes referred hereinafter only as gold) is then plated on the nickel layer. The patterned gold-plated copper layer of the PCB ensures a good electrical connection between semiconductive layer portion 18*b* and the conductive vias of the PCB that connect to the electrical circuit elements on the top surface of the PCB. It was found that there was no significant amount of air trapped under the PCB because the patterned gold-plated copper layer on back of the PCB is embossed into semiconductive layer portion 18*b*, thereby ensuring optimal electrical contact between semiconductive layer portion 18*b* and voltage sensor PCB Output signals from the voltage sensor are on the order of about 1 Volt with a current on the order of microamperes.

Like a solid layer, the patterned gold-plated copper layer of the present invention will provide an infinite amount of contact points. The distance from one contact point to another is insignificant, as it is with a solid layer. The pattern created in the copper layer may be any suitable pattern, including but not limited to, a grid with a square or diamond shaped pattern. It is believed that a patterned gold-plated copper layer is less likely to flake than a gold-plated plane such as would exist if an unpatterned copper foil were gold plated. This is especially an issue with thin, flexible PCBs, which are subject to mechanical stresses due to their ability to bend.

The voltage sensor PCB described herein differs from standard PCBs in that standard PCBs have solder resist layers covering the front and back surfaces of the PCB, except for conductive areas at which electrical contact (typically by soldering) will be made. In the present voltage sensor 102, there is no solder resist on the bottom of the PCB. It is believed that the need for a solder layer on the back of the PCB, which typically inhibits the planar gold-plating from flaking, is not needed due to the copper layer being patterned prior to gold plating. It is believed that the patterned copper layer more easily dissipates mechanical stress than does a solid copper foil.

In addition to the foregoing, the use of the PCB in the present application further limits the amount of mechanical stress applied to the PCB. The PCB is subject to mechanical stress when it is bent and placed around interface cable 12. Although this bent configuration may place some stress on the PCB, once it is affixed to interface cable 12, e.g., with a PVC tape, and especially after stress control tube 36 and tubular sleeve 52 are shrunk down around the interface cable 12, thereby applying a radial force to the PCB of voltage sensor 102, the flexible PCB remains in a relatively static state.

Although the invention has been described and illustrated with reference to specific illustrative embodiments thereof, it is not intended that the invention be limited to those illustrative embodiments. Those skilled in the art will recognize that variations and modifications can be made without departing from the true scope of the invention as defined by the claims that follow. It is therefore intended to include within the invention all such variations and modifications as fall within the scope of the appended claims and equivalents thereof.

The invention claimed is:

1. Terminal connection device for connecting an end of a medium- or high-voltage power cable (42) to a connection point, the terminal connection device (10) comprising
    a) an interface cable (12) having first and second end portions, comprising an inner conductor (14) and a conductive or semiconductive layer (18),
    b) a first stress control tube (36) comprising
    a stress control element (38), and
    an insulating layer (40) arranged around the stress control element (38),
    wherein the first stress control tube (36) is mounted on the first end portion of the interface cable (12);
    c) a first cable connector (24) for connecting the interface cable (12) to the power cable (42), the first cable connector (24) being connected to the second end portion of the interface cable (12);
    d) a second stress control tube (36') comprising
    a stress control element (38), and
    an insulating layer (40) arranged around the stress control element (38), wherein the second stress control tube (36') is mounted over the second end portion of the interface cable (12) and at least a portion of the first cable connector (24);
    e) one or more tubular shrinkable sleeves (52, 52', 52"), at least a portion of one of the tubular shrinkable sleeves (52, 52', 52") extending over at least a portion of the first stress control tube (36), and at least a portion of one of the tubular shrinkable sleeves (52, 52', 52") extending over at least a portion of the second stress control tube (36'),
    wherein the portion of the tubular shrinkable sleeve (52, 52") extending over at least a portion of the first stress control tube (36) is shrunk down around at least a portion of the first stress control tube (36).

2. Terminal connection device according to claim 1, wherein the first cable connector (24) is connected to the power cable (42) by engagement between the first cable connector (24) and a mating second cable connector (26) mounted on an end of the power cable (42).

3. Terminal connection device according to claim 1, wherein a portion of at least one of the tubular shrinkable sleeves (52, 52', 52") is shrunk down around a portion of the interface cable (12).

4. Terminal connection device according to claim 1, wherein the tubular shrinkable sleeve (52, 52') extending over at least a portion of the second stress control tube (36') comprises a portion adapted to be shrunk down around a portion of the power cable (42).

5. Terminal connection device according to claim 1, wherein the first end portion of the interface cable (12) is attached to a lug (34).

6. Terminal connection device according to claim 1, wherein the stress control element (38) of one or both of the first and second stress control tubes (36, 36') is a geometric stress control element or a dielectric stress control element.

7. Terminal connection device according to claim 1, wherein the tubular shrinkable sleeve (52, 52") extending over at least a portion of the first stress control tube (36) comprises, on an outer side, one or more skirts (56) for reducing tracking current.

8. Terminal connection device according to claim 1, wherein the interface cable (12) further comprises an insulating layer (40) arranged concentrically around at least an axial section of the inner conductor (14), and wherein the terminal connection device (10) comprises a capacitive voltage sensor (102) including a printed circuit board element, the printed circuit board element placed over an electrically isolated piece of conductive or semiconductive material, the electrically isolated piece of conductive or semiconductive material arranged on the insulating layer (40) of the interface cable (12) and operable to form an electrode of a sensing capacitor for sensing a voltage of the inner conductor (14), and wherein the insulating layer (40) is operable to form a dielectric of the sensing capacitor.

9. Terminal connection device according to claim 8, wherein the terminal connection device (10) further comprises additional semiconductive material, arranged concentrically around at least an axial section of the insulating layer (40) on either side of the electrically isolated piece of conductive or semiconductive material, the additional semiconductive material comprising two semiconductive axial sections, electrically isolated from the electrically isolated piece of conductive or semiconductive material by nonconductive axial sections (100).

10. Terminal connection device according to claim 8 wherein some or all of the electrically isolated piece of conductive or, semiconductive material or of the additional semiconductive material is affixed adhesively to the insulating layer (40).

11. Terminal connection device according to claim 8 wherein the printed circuit board element comprises a patterned gold-plated copper layer in electrical contact with the electrically isolated piece of conductive or semiconductive material.

12. Terminal connection device according to claims 8 wherein the electrically isolated piece of conductive or semiconductive material comprises a portion of the semiconductive layer (18) of the interface cable (12).

13. Method of connecting an end of a medium- or high-voltage power cable (42) to a connection point, comprising the steps of
 a) providing a terminal connection device (10) according to claim 1;
 b) providing a medium- or high-voltage power cable (42);
 c) connecting the terminal connection device (10) to an end of the power cable (42) by connecting the interface cable (12) to the end of the power cable (42) via the first cable connector (24); and
 d) connecting the terminal connection device (10) to the connection point by connecting the first end portion of the interface cable (12) to the connection point.

\* \* \* \* \*